US 6,711,534 B1

(12) United States Patent
Parashkevov

(10) Patent No.: US 6,711,534 B1
(45) Date of Patent: Mar. 23, 2004

(54) METHOD OF ANALYZING A CIRCUIT HAVING AT LEAST ONE STRUCTURAL LOOP BETWEEN DIFFERENT CHANNEL CONNECTED COMPONENTS WITHIN THE CIRCUIT

(75) Inventor: Atanas Nikolaev Parashkevov, Valley View (AU)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/393,988

(22) Filed: Sep. 10, 1999

(51) Int. Cl.$^7$ .............................. G06F 17/50; G06F 9/45
(52) U.S. Cl. .................................................. 703/15; 716/5
(58) Field of Search .......................... 703/15; 364/488, 364/489; 716/5

(56) References Cited

U.S. PATENT DOCUMENTS

| | | |
|---|---|---|
| 5,084,824 A | 1/1992 | Lam et al. |
| 5,210,699 A | 5/1993 | Harrington |
| 5,629,858 A | 5/1997 | Kundu et al. |
| 5,677,848 A | 10/1997 | Singh et al. |
| 5,883,811 A * | 3/1999 | Lam ............................... 716/6 |
| 6,014,510 A * | 1/2000 | Burks et al. ................... 703/19 |
| 6,295,636 B1 * | 9/2001 | Dupenloup .................... 716/18 |

OTHER PUBLICATIONS

"Analysis of Cyclic Combinational Circuits" by Sharad Malik published by IEEE 1993.
"Error Diagnosis for Transistor–Level Verification" by A. Kuehlmann, D.I. Cheng, A. Srinivasan and D.P. LaPotin.
"The Necessity of Closed Circuit Loops in Minimal Combinational Circuits" by W. H. Kautz in IEEE Transactions on Computers, Feb. 1970, pp. 162–164.
"Formal Verification of PowerPC™ arrays using symbolic trajectory evaluation" by M. Pandey, R. Raimi, D.L. Beatty and R.E. Bryant and published at the 33$^{rd}$ Design Automation Conference in 1996.
"Boolean Analysis of MOS Circuits" by R. E. Bryant published in IEEE TCAD, 6(4), pp. 634–649, Jul. 1987.
"Extraction of Gate–Level Models from Transistor Circuits by Four–Valued Symbolic Analysis" by R. E. Bryant and published in ICCAD '91.
"Comparing Layouts with HDL Models: a Formal Verification Technique" by T. Kam and P. A. Subrahmanyam published in IEEE TCAD, Apr. 1995, pp. 503–509.
"Verity—a Formal Verification Program for Custom CMOS Circuits" by A. Kuehlmann, A. Srinivasan and D. P. LaPotin published in the IBM R & D Journal, vol. 39, pp. 149–165, Jan.–Mar. 1995.
"VERTEX: Verification of Transistor–Level Circuits based on model Extraction" by J. Moondanos, J.A. Wehbeh, J.A. Abraham and D.G. Saab and published in EDAC '93.

* cited by examiner

Primary Examiner—Samuel Broda
Assistant Examiner—Herng-der Day
(74) Attorney, Agent, or Firm—Daniel K. Nichols

(57) ABSTRACT

A method of analyzing a circuit having a structural loop between different channel connected components within the circuit first splits the circuit into its constituent channel connected components (100). The structural loops are then detected and broken (101) before obtaining a pair of boolean functions at each break point (102) by inserting a pair of temporary boolean variables at the break point on a boundary between different channel connected components and analyzing each channel connected component in the structural loop utilizing the pair of temporary boolean variables to obtain the pair of boolean functions representing the functionality of the circuit at the break point. The pair of boolean functions are then analyzed (103) to determine whether the structural loop is sequential in nature, and, if so, the pair of boolean functions is modified (105) in order to remove any dependence in the pair of boolean functions on the pair of boolean variables.

5 Claims, 2 Drawing Sheets

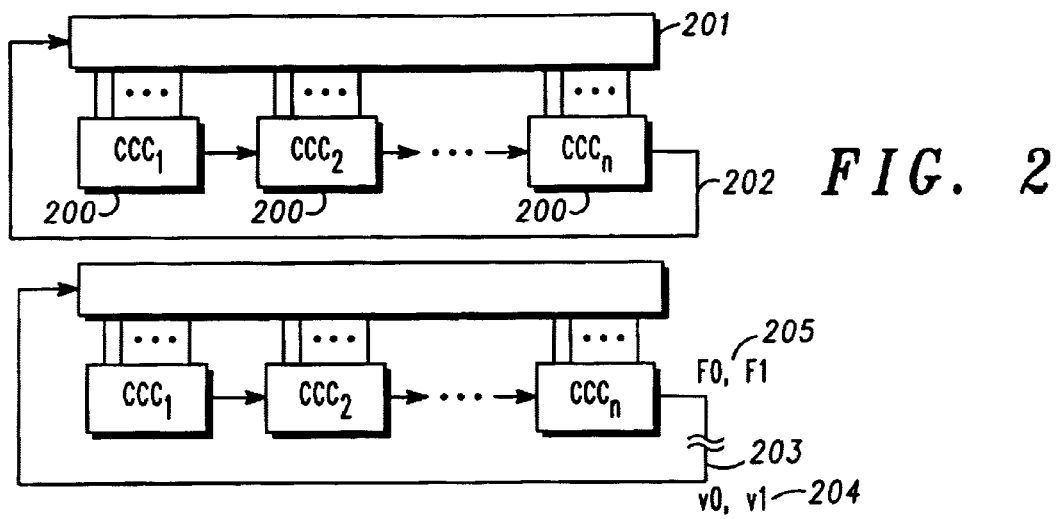
*FIG. 2*
| LOOP SIGNATURE | INFERRED TYPE LOOP |
|---|---|
| 0 | COMBINATION LOOP; THE PAIR OF BOOLEAN FUNCTIONS DOES NOT DEPEND ON EITHER OF THE TEMPORARY BOOLEAN VARIABLES. |
| 1 | SEQUENTIAL LOOP IMPLEMENTING A HALF-LATCH THAT CAN KEEP A VALUE OF 0 BUT NOT A VALUE OF 1. |
| 8 | SEQUENTIAL LOOP IMPLEMENTING A HALF-LATCH THAT CAN KEEP A VALUE OF 1 BUT NOT A VALUE OF 0. |
| 9 | SEQUENTIAL LOOP IMPLEMENTING A LATCH |
*FIG. 3*
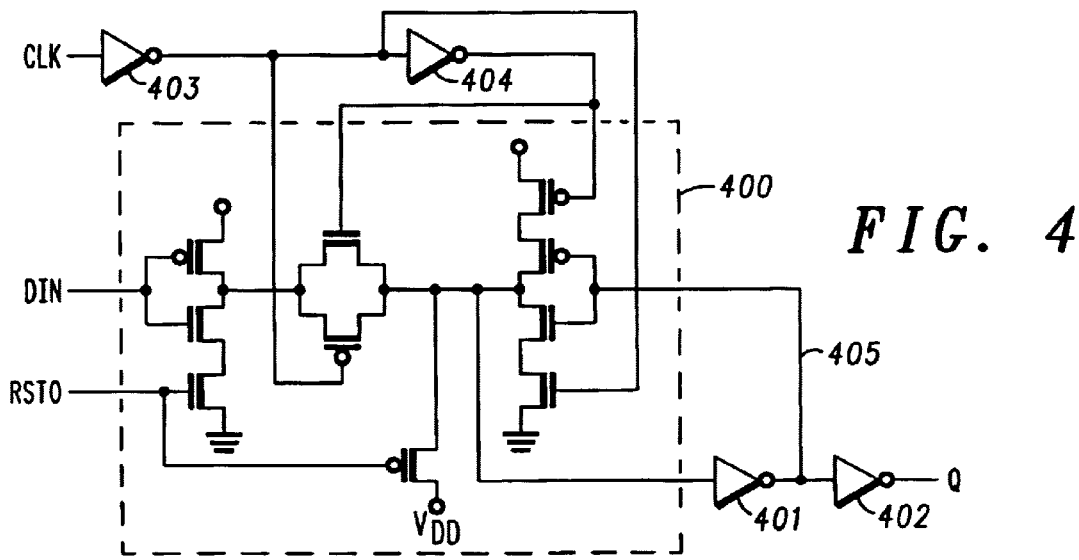
*FIG. 4*

METHOD OF ANALYZING A CIRCUIT HAVING AT LEAST ONE STRUCTURAL LOOP BETWEEN DIFFERENT CHANNEL CONNECTED COMPONENTS WITHIN THE CIRCUIT

FIELD OF THE INVENTION

This invention relates to a method of analyzing a circuit having at least one structural loop between different channel connected components within the circuit, especially, though not exclusively, for use in Computer-Aided Design (CAD) tools for Electronic Design Automation (EDA), and more particularly for deriving equivalent behavior of mixed (gate and switch) level digital circuits.

BACKGROUND OF THE INVENTION

Contemporary chip design depends critically on the availability of appropriate EDA CAD tools in order to keep up with the ever-increasing chip complexity. Designers typically work with chip descriptions at several levels of abstraction. The Register-Transfer Level (RTL) describes a circuit at the high level of boolean functions and data flow within the circuit much like a regular programming language does. Gate-level descriptions provide a structural (schematic) description of a circuit as an interconnection of basic blocks called gates, whereas every gate has a known and relatively simple boolean behavior. Switch-level descriptions represent the lowest level of circuit design abstraction which again is a structural (schematic) one and contains an interconnection of switches (transistors) that implement the desired functionality of the circuit.

RTL is often the preferred abstraction level for most design activities, however, any RTL design has to be translated into an equivalent switch-level design as a necessary step prior to the fabrication of the chip. This translation can be performed using so-called synthesis EDA tools that compile RTL designs into a predefined, technology-specific gate-level cell library that contains a switch-level schematic for each cell. In some cases, especially when a chip has to meet stringent operating requirements (speed, power consumption, etc.), certain blocks of the chip may be designed at the switch level.

For a number of reasons, it is highly desirable and advantageous to accurately translate the functionality implemented by a circuit description containing switches into a higher level (gate or RTL) one. A very important application of such a technology is formal functional verification of circuits. Formal functional verification aims to ensure that a chip operates as expected based on appropriate mathematical models. Unlike traditional functional verification approaches, such as simulation, formal verification provides 100% coverage of a circuit's functionality. To enable formal functional verification at the mixed (switch and gate) level, a method is required to translate the structural description of a circuit into a functional (boolean) description in the corresponding mathematical model. Other application areas for mixed (switch and gate) level circuit analysis and translation include technology-specific library characterization, Automatic Test Pattern Generation (ATPG), and re-synthesis and re-design of chips from one chip manufacturing technology to another.

Various techniques have been developed for the analysis of the behavior of mixed (switch and gate) level circuits. These techniques process the circuit in parts called Channel Connected Components (CCC). A CCC comprises of transistors that are electrically connected to each other via their channel terminals and other transistors in the CCC, and gates connected to the channel terminals of any transistor in the CCC. The CCCs in a circuit can be analyzed one at a time; there are known techniques that can accomplish that based on explicit or implicit conductive transistor path enumeration. Individual CCC behavior is then composed to obtain the behavior of the complete circuit.

Thus, a key aspect in deriving a functional model of a complete circuit is the ability to identify and properly characterize the behavior introduced by structural dependency loops between two or more CCCs in the circuit. Structural loops may result in combinational, sequential, or oscillatory behavior. Existing approaches either represent this behavior at a very low level or completely ignore the problem. For example, the ANAMOS and TRANALYZE tools, as presented in the article "Boolean Analysis of MOS Circuits" by R. E. Bryant published in IEEE TCAD, 6(4), pp. 634–649, July 1987, and later refined in the article "Extraction of Gate-Level Models from Transistor Circuits by Four-Valued Symbolic Analysis" also by R. E. Bryant and published in ICCAD '91 resolve structural loops between CCCs by inserting a unit delay element into the loop. The derived circuit model therefore contains an extra input—the so-called "simulation clock", and is likely to contain many more state-storing elements than the original gate/RTL level design. These tools were developed at the Carnegie Mellon University for the purpose of transistor-level simulation and mapping into a hardware-based gate-level simulator and derive models of the circuit that are not directly suitable for obtaining an RTL description similar to the desired design. This essentially prohibits the interaction of ANAMOS and TRANALYZE with the majority of the currently available EDA CAD tools. Furthermore, the method for deriving a circuit description suitable for formal verification and/or resynthesis from the model produced by ANAMOS and TRANALYZE in the article "Comparing Layouts with HDL Models: a Formal Verification Technique" by T. Kam and P. A. Subrahmanyam published in IEEE TCAD, April 1995, pp. 503–509 involves an elaborate and computationally intensive process which is not suitable for circuits of any practical size.

Another approach to mixed (gate and switch) level circuit analysis has been implemented in the Verity tool developed by International Business Machines Corporation, and described in the article "Verity—a Formal Verification Program for Custom CMOS Circuits" by A. Kuehlmann, A. Srinivasan and D. P. LaPotin published in the IBM R & D Journal, Vol. 39, pp. 149–165, January–March 1995. This tool is a logic checker capable of working at the switch level. It only goes as far as analyzing if a structural loop of CCCs results in combinational or sequential behavior. In the latter case, the user is informed of the presence of a non-combinational loop and circuit analysis is aborted. Furthermore, the technique fails to properly recognize combinational loops in some cases. The tool does not output an equivalent higher-level model nor does it work directly on sequential designs.

BRIEF SUMMARY OF THE INVENTION

The present invention therefore seeks to provide a method of analyzing a circuit having at least one structural loop between different channel connected components within the circuit, which overcomes, or at least reduces the above-mentioned problems of the prior art.

Accordingly, the invention provides a method of analyzing a circuit, the circuit having at least one structural loop between different channel connected components within the circuit, the method comprising the steps of:

at least partly notionally splitting the circuit into its constituent channel connected components;

detecting the at least one structural loop;

inserting a pair of temporary boolean variables at a break point on a boundary between different channel connected components to notionally break the at least one structural loop;

analyzing each channel connected component in the at least one structural loop utilizing the pair of temporary boolean variables at the break point in order to obtain a pair of boolean functions representing the functionality of the circuit at the at least one break point;

analyzing the pair of boolean functions, including determining whether the at least one structural loop is sequential in nature; and modifying the pair of boolean functions when the at least one structural loop is sequential in nature in order to remove any dependence in the pair of boolean functions on the pair of boolean variables.

In a preferred embodiment, the method further comprises the step of utilizing the pair of boolean functions to produce an RTL description of the circuit in any desired RTL language. The circuit may include at least one transistor-level component and/or at least one gate-level component.

Preferably, the step of analyzing the pair of boolean functions comprises:

reformulating each of the pair of boolean functions to have at least a first term which is independent of both of the boolean variables, at least a second term dependent on one of the boolean variables, and at least a third term which is dependent on the inverse of said one of the boolean variables, wherein any of the terms may be zero;

determining whether the second term is non-zero and whether the third term is zero, in which case the at least one structural loop is sequential in nature.

The step of modifying the boolean functions preferably involves setting the second term to zero.

The step of analyzing the pair of boolean functions preferably includes determining whether the at least one structural loop is combinational in nature. This step preferably comprises:

reformulating each of the pair of boolean functions to have at least a first term which is independent of both of the boolean variables, at least a second term dependent on one of the boolean variables, and at least a third term which is dependent on the inverse of said one of the boolean variables, wherein any of the terms may be zero;

determining whether both the second and third terms are zero, in which case the at least one structural loop is combinational in nature.

The step of analyzing the pair of boolean functions preferably includes determining whether the at least one structural loop is oscillatory in nature and preferably outputting a signal indicating that the circuit includes an oscillatory loop when the at least one structural loop is oscillatory in nature. This step preferably comprises:

reformulating each of the pair of boolean functions to have at least a first term which is independent of both of the boolean variables, at least a second term dependent on one of the boolean variables, and at least a third term which is dependent on the inverse of said one of the boolean variables, wherein any of the terms may be zero;

determining whether the third term is non-zero, in which case the at least one structural loop is oscillatory in nature.

The step of analyzing the pair of boolean functions preferably includes the steps of:

determining a loop signature for the at least one structural loop by combing each boolean function when dependent on a different one of the pair of boolean variables having different bias values, so as to obtain a unique signature for each possible combination of terms;

determining whether the unique signature is one of a set of predetermined unique values; and making each of the boolean functions dependent on only one of the boolean variables by replacing the other of the boolean variables by an inverse of the one of the boolean variables, when the loop signature is not one of the set of predetermined unique values.

BRIEF DESCRIPTION OF THE DRAWINGS

One embodiment of the invention will now be more fully described, by way of example, with reference to the drawings, of which:

FIG. 2 illustrates schematically a circuit having at least two CCCs with structural loops between them, which are detected and broken;

FIG. 3 contains a table with interpretations for loop signatures;

FIG. 4 shows an example of a circuit to which the method shown in FIG. 1 can be applied.

DETAILED DESCRIPTION OF THE DRAWINGS

Figure 1:
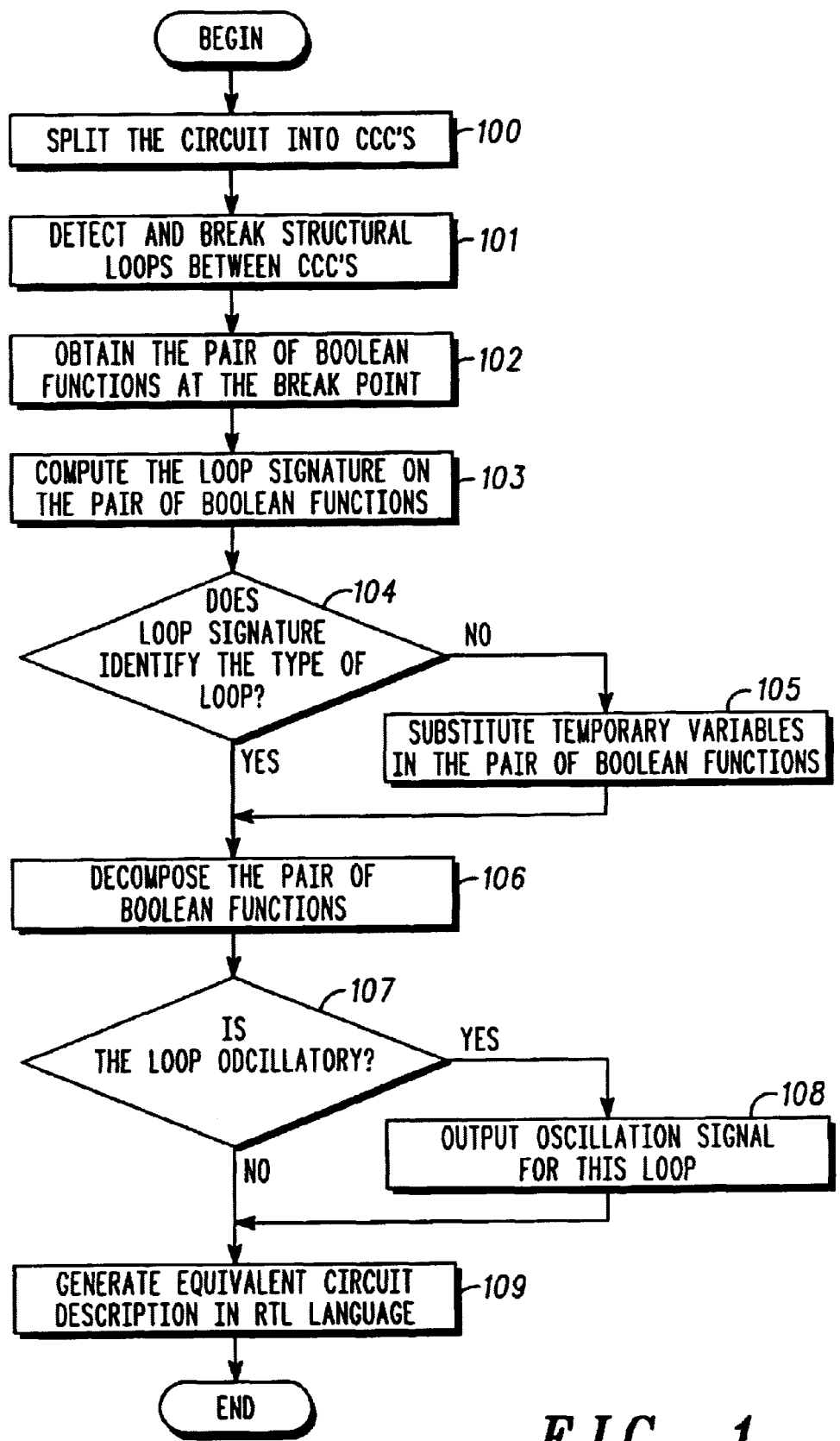
FIG. 1 shows a flow chart of a method of analyzing a circuit incorporating an embodiment of the present invention.

Thus, as shown in FIG. 1, method of analyzing a circuit according to one embodiment of the present invention contains of a number of algorithmic steps. In step 100, the mixed (switch and gate) level input circuit is split into CCCs by utilizing known graph-based algorithms (see, for example, the article entitled "Boolean Analysis of MOS Circuits" by R. E. Bryant published in IEEE TCAD, 6(4), pp. 634–649, July 1987).

Step 101 aims to detect the presence of structural loops between two or more CCCs. One particular approach is to use a recursive depth-first traversal of the circuit starting at its top-level output and inout ports and ending at the top-level input and inout ports. Loops are detected by marking the nets and CCCs when visited by the traversal and occur when:

A net which is an input to a CCC currently being explored is marked; or

A net which is an input to a CCC currently being explored is a part of a CCC which is marked. In the text that follows, the following notation is used:

Boolean function names start with an upper-case letter, e.g. F0,X1,Z1;

Boolean variable names start with a lower-case letter, e.g. v0,

Boolean negation is denoted by the operator '!';

Boolean conjunction is denoted by the operator '&';

Boolean disjunction is denoted by the operator '|';

(F depends on v) is a function that returns 1 if the value of F when v=0 is different from the value of F when v=1, and 0 otherwise.

The operation of step 101 is further illustrated in FIG. 2. A structural loop 202 is formed by two or more CCCs 200, which have a number of input and output nets 201. Having been detected, the structural loop 202 is notionally broken at the break point net 203, by introducing two new independent boolean variables 204 annotated as v0 and v1. In this embodiment, variable v0 denotes the condition under which the break point net 203 is pulled low, whereas v1 denotes the condition under which the break point net 203 is pulled high.

In step 102, the channel-connected components 200 are analyzed with respect to the boolean functions at nets 201 and the temporary boolean variables 204 in order to obtain a pair of boolean functions 205 annotated as F0 and F1 that describe the functionality at the break point net 203. In this embodiment, function F0 contains the condition under which the break point net 203 is pulled low, whereas F1 denotes the condition under which the break point net 203 is pulled high. The derivation of the pair of boolean functions 205 is performed. One particular approach is to derive the functionality of the channel connected components 200 in isolation, followed by functional composition along the path of the structural loop 202.

In step 103, a so-called loop signature is computed on the pair of boolean functions 205, in order to characterize the dependence of the pair of boolean functions 205 on the pair of temporary boolean variables 204. The loop signature is computed as follows:

LoopSignature=(F1 depends on v1)*8+(F1 depends on v0)*4+(F0 depends on v1)*2+(F0 depends on v0)

and by definition is an integer between 0 and 15.

In step 104, the loop signature value obtained is compared to predefined values, which are taken from a table, such as that illustrated in FIG. 3. If a match is obtained, the execution of this process flow proceeds to step 106. If no match is obtained, step 105 is executed prior to step 106.

In step 105, the pair of boolean functions 205 is simplified under the assumption that the functionality of the breakpoint net 202 is boolean. This is achieved by:

1. Substituting any occurrence of v0 in F1 with !v1; and
2. Substituting any occurrence of v1 in F0 with !v0.

which results in F1 being independent of v0, as well as F0 being independent of v1. Thus, the execution of step 105 guarantees that the loop signature value on the modified functions F0 and F1 yields a match with the predefined values listed in FIG. 3.

In step 106, the pair of boolean functions 205, possibly modified by the execution of step 105, is decomposed into sub-functions using known techniques (for example, by utilizing Binary Decision Diagrams) in the following way:

F0=X0|Y0 & v0|Z0 & !v0
F1=X1|Y1 & v1|Z1 & !v1 where none of the sub-functions X0, Y0, Z0, X1, Y1, Z1 depend on the temporary boolean variables 204. By definition, the conjunction of any two boolean functions from the set of sub-functions X0, Y0, and Z0 is 0, and the conjunction of any two boolean functions from the set of sub-functions X1, Y1, and Z1 is 0.

In step 107, a check is made whether the structural loop 202 has oscillatory behavior. This is the case when either:

1. $Z0 \neq 0$; or
2. $Z1 \neq 0$ since at least one of the equations F0=v0 and F1=v1 does not have a stable solution when at least one of the above two conditions is true.

If that is the case, a corresponding signal is output to the user in step 108 and the analysis of the structural loop 202 ends. If the structural loop 202 does not exhibit oscillatory behavior, step 109 is executed.

In step 109, the loop signature is re-computed on the pair of boolean functions 205, possibly modified by the execution of step 105, to determine whether the loop is combinational or sequential in nature using FIG. 3, and generate a description of the behavior of the structural loop 202 in a chosen RTL language. Note that the execution of step 107 guarantees that in step 109 the following applies:

Z0=Z1=0.

If the loop signature is 0 (or, in other words, Y0=Y1=0), the structural loop 202 exhibits combinational behavior, and the break point net 203 is pulled high when X1=1, and low when X0=1. As an example of the output only, the equivalent RTL statements in the Verilog language are given as:

assign<break-point-net-name>=X1 ? 1'b1: 1'bz;
assign<break-point-net-name>=X0 ? 1'b0: 1'bz;

If the loop signature is 9, the structural loop 202 exhibits sequential (latch) behavior, and the break point net 203 keeps its previous value when X0=X1=0. As an example of the output only, the equivalent RTL statements in the Verilog language are given as:

always @(list of all nets on which X0 or X1 depend)
  if(X0|X1)
    <break-point-net-name>=X1;

If the loop signature is 1, the structural loop 202 exhibits sequential (half-latch) behavior, and the break point net 203 keeps its previous value of 0 when X0=X1=0, but cannot keep a value of 1. As an example of the output only, the equivalent RTL statements in the Verilog language are given as:

always @(list of all nets on which X0 or X1 depend)
  if (X0|X1)
    <break-point-net-name>=X1;
  else if (<break-point-net-name>)
    <break-point-net-name>=1'bz;

If the loop signature is 8, the structural loop 202 exhibits sequential (half-latch) behavior, and the break point net 203 keeps its previous value of 1 when X0=X1=0, but cannot keep a value of 0. As an example of the output only, the equivalent RTL statements in the Verilog language are given as:

always @(list of all nets on which X0 or X1 depend)
  if(X0|X1)
    <break-point-net-name>=X1;
  else if (!<break-point-net-name>)
    <break-point-net-name>=1'bz;

In FIG. 4, a simple mixed (gate and switch) level circuit constituting a latch with asynchronous reset signal is shown. In step 100, the circuit is split into channel connected components 400, 401, 402, 403, and 404. In step 101, a structural loop between the CCCs 400 and 401 is identified and broken at net 405 with a pair of temporary boolean variables v0 and v1. In step 102, the pair of boolean functions:

F0=!RST0|CLK & v0|!CLK & !DIN
F1=!CLK & RST0 & DIN|CLK & v1 is obtained by successive analysis of each CCC in isolation. In step 103, the loop signature is computed, yielding the value of 9. In step 104, it is established that a match is found with the predefined loop signatures from FIG. 3. Thus, step 105 is not executed. In step 106, the following decomposition of F0 and F1 are obtained:

X0=!RST0|!CLK & !DIN
Y0=CLK
Z0=0
X1=!CLK & RST0 & DIN
Y1=CLK

Z1=0 and thus step 107 will not identify the behavior of this loop as oscillatory and step 108 will not be executed. In step 109, the loop signature identifies the loop as sequential, and, as an example only, the following Verilog code is generated:

always @(CLK or DIN or RST0)
  if(!RST0|!CLK)
    <net-405-name>=!CLK & RST0 & DIN;

Accordingly, the RTL language description is provided, after the circuit has been analyzed, which is much closer to the original RTL/gate-level design, than has been possible with presently known techniques.

It will be appreciated that although only one particular embodiment of the invention has been described in detail, various modifications and improvements can be made by a person skilled in the art without departing from the scope of the present invention.

What I claim is:

1. A method of analysing a circuit, the circuit having at least one structural loop between different channel connected components within the circuit, the method comprising the steps of:

at least partly notionally splitting the circuit into its constituent channel connected components;

detecting the at least one structural loop;

inserting a pair of temporary boolean variables at a break point on a boundary between different channel connected components to notionally break the at least one structural loop;

analysing each channel connected component in the at least one structural loop utilising the pair of temporary boolean variables at the break point in order to obtain a pair of boolean functions representing the functionality of the circuit at the break point;

analysing the pair of boolean functions, including determining whether the at least one structural loop is sequential in nature; and modifying the pair of boolean functions when the at least one structural loop is sequential in nature in order to remove any dependence in the pair of boolean functions on the pair of boolean variables;

wherein the step of analysing the pair of boolean functions comprises:

reformulating each of the pair of boolean functions to have at least a first sub-function which is independent of both of the boolean variables, at least a second sub-function dependent on one of the boolean variables, and at least a third sub-function which is dependent on the inverse of said one of the boolean variables, wherein any of the sub-functions may be zero; and determining whether at least one of the second sub-functions is non-zero and all of the third sub-functions are zero, in which case the at least one structural loop is sequential in nature.

2. A method of analysing a circuit according to claim 1, wherein the step of modifying the boolean functions involves setting the second sub-function to zero.

3. A method of analysing a circuit, the circuit having at least one structural loop between different channel connected components within the circuit, the method comprising the steps of:

at least partly notionally splitting the circuit into its constituent channel connected components;

detecting the at least one structural loop;

inserting a pair of temporary boolean variables at a break point on a boundary between different channel connected components to notionally break the at least one structural loop;

analysing each channel connected component in the at least one structural loop utilising the pair of temporary boolean variables at the break point in order to obtain a pair of boolean functions representing the functionality of the circuit at the break point;

analysing the pair of boolean functions, including determining whether the at least one structural loop is sequential in nature; and modifying the pair of boolean functions when the at least one structural loop is sequential in nature in order to remove any dependence in the pair of boolean functions on the pair of boolean variables;

wherein the step of analysing the pair of boolean functions includes determining whether the at least one structural loop is combinational in nature, and wherein the step of determining whether the at least one structural loop is combinational in nature comprises:

reformulating each of the pair of boolean functions to have at least a first sub-function which is independent of both of the boolean variables, at least a second sub-function dependent on one of the boolean variables, and at least a third sub-function which is dependent on the inverse of said one of the boolean variables, wherein any of the sub-functions may be zero; and determining whether all the second and third sub-functions are zero, in which case the at least one structural loop is combinational in nature.

4. A method of analysing a circuit, the circuit having at least one structural loop between different channel connected components within the circuit, the method comprising the steps of:

at least partly notionally splitting the circuit into its constituent channel connected components;

detecting the at least one structural loop;

inserting a pair of temporary boolean variables at a break point on a boundary between different channel connected components to notionally break the at least one structural loop;

analysing each channel connected component in the at least one structural loop utilising the pair of temporary boolean variables at the break point in order to obtain a pair of boolean functions representing the functionality of the circuit at the break point;

analysing the pair of boolean functions, including determining whether the at least one structural loop is sequential in nature; and modifying the pair of boolean functions when the at least one structural loop is sequential in nature in order to remove any dependence in the pair of boolean functions on the pair of boolean variables;

the step of analysing the pair of boolean functions includes determining whether the at least one structural loop is oscillatory in nature, and wherein the step of determining whether the at least one structural loop is oscillatory in nature comprises:

reformulating each of the pair of boolean functions to have at least a first sub-function which is independent of both of the boolean variables, at least a second sub-function dependent on one of the boolean variables, and at least a third sub-function which is dependent on the inverse of said one of the boolean variables, wherein any of the sub-functions may be zero; and determining whether at least one of the third sub-functions is non-zero, in which case the at least one structural loop is oscillatory in nature.

5. A method of analysing a circuit, the circuit having at least one structural loop between different channel connected components within the circuit, the method comprising the steps of:

at least partly notionally splitting the circuit into its constituent channel connected components;

detecting the at least one structural loop;

inserting a pair of temporary boolean variables at a break point on a boundary between different channel connected components to notionally break the at least one structural loop;

analysing each channel connected component in the at least one structural loop utilising the pair of temporary boolean variables at the break point in order to obtain a pair of boolean functions representing the functionality of the circuit at the break point;

analysing the pair of boolean functions, including determining whether the at least one structural loop is sequential in nature; and modifying the pair of boolean functions when the at least one structural loop is sequential in nature in order to remove any dependence in the pair of boolean functions on the pair of boolean variables;

wherein the step of analysing the pair of boolean functions includes the steps of:

determining a loop signature for the at least one structural loop by combing each boolean function when dependent on a different one of the pair of boolean variables having different bias values, so as to obtain a unique signature for each possible combination of terms;

determining whether the unique signature is one of a set of predetermined unique values; and making each of the boolean functions dependent on only one of the boolean variables by replacing the other of the boolean variables by an inverse of the one of the boolean variables, when the loop signature is not one of the set of predetermined unique values.

* * * * *